US 6,725,177 B2

(12) United States Patent
David et al.

(10) Patent No.: US 6,725,177 B2
(45) Date of Patent: Apr. 20, 2004

(54) SYSTEM FOR MONITORING CONNECTION PATTERN OF DATA PORTS

(75) Inventors: Solomon I. David, Singapore (SG); Peter Lawrence Pela, Phoenix, AZ (US)

(73) Assignee: iTRACS Corporation, Westchester, IL (US)

(*) Notice: Subject to any disclaimer, the term of this patent is extended or adjusted under 35 U.S.C. 154(b) by 0 days.

(21) Appl. No.: 10/437,653

(22) Filed: May 13, 2003

(65) Prior Publication Data

US 2003/0204356 A1 Oct. 30, 2003

Related U.S. Application Data

(62) Division of application No. 09/937,983, filed as application No. PCT/SG00/00045 on Apr. 5, 2000, now Pat. No. 6,574,586.

(30) Foreign Application Priority Data

Apr. 6, 1999 (SG) .............................................. 9901521
Apr. 5, 2000 (SG) .......................................... 200001891

(51) Int. Cl.⁷ ............................................... G06F 13/00
(52) U.S. Cl. ..................... 702/183; 702/188; 702/122; 439/488; 439/489
(58) Field of Search ............................... 702/183, 118, 702/120, 122, 124, 126, 182, 186, 188, 189, FOR 103, FOR 104, FOR 134, FOR 135, FOR 170, FOR 171; 709/220–222, 224; 370/248, 241; 324/538, 66; 340/687, 686.1; 375/257, 258; 345/736, 969, 966; 439/49, 488, 489, 490, 491, 913, 955, 188, 218, 323, 325, 945; 379/25, 27.01, 27.04, 26.01

(56) References Cited

U.S. PATENT DOCUMENTS

| 5,483,467 A | 1/1996 | Krupka et al. ............... 709/200 |
| 5,764,043 A | 6/1998 | Czosnowski et al. ......... 324/66 |
| 5,870,626 A | 2/1999 | Lebeau ......................... 710/11 |
| 6,222,908 B1 | 4/2001 | Bartolutti et al. ......... 379/27.01 |
| 6,227,911 B1 | 5/2001 | Boutros et al. ............. 439/620 |
| 6,229,538 B1 | 5/2001 | McIntyre et al. ........... 345/734 |
| 6,234,830 B1 | 5/2001 | Enz et al. .................... 439/491 |
| 6,244,896 B1 * | 6/2001 | Boutros .................... 439/541.5 |
| 6,285,293 B1 | 9/2001 | German et al. ............. 340/687 |
| 6,330,307 B1 * | 12/2001 | Bloch et al. ................... 379/25 |
| 6,381,283 B1 | 4/2002 | Bhardwaj et al. ........... 375/257 |
| 6,561,852 B2 * | 5/2003 | Lo .............................. 439/638 |

FOREIGN PATENT DOCUMENTS

| HU | 201415 A | 10/1990 |
| HU | 216212 B | 5/1999 |

* cited by examiner

Primary Examiner—Hal Wachsman
(74) Attorney, Agent, or Firm—Stroock & Stroock & Lavan LLP

(57) ABSTRACT

The present invention determines and monitors the connection pattern of data ports which are connected by multiconductor cables. An adapter jacket having an external contact is placed over a standardized cable such as an RJ45 cable which connects the data ports. An adapter board having a plurality of socket contacts is placed adjacent a plurality of data ports. An output and input module are coupled to the socket contacts. A micro-processor which is coupled to the output and input module scans the socket contacts to determine the connection pattern of the data ports.

4 Claims, 14 Drawing Sheets

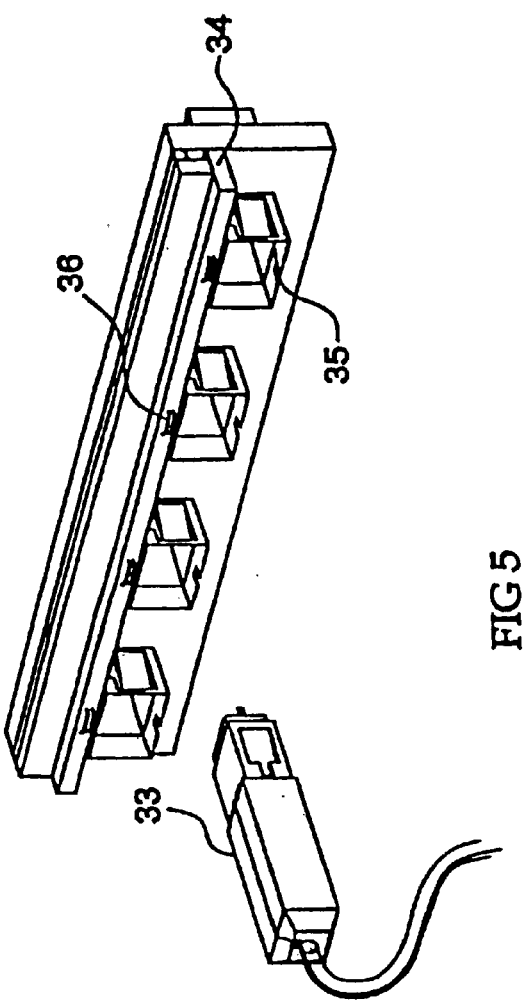
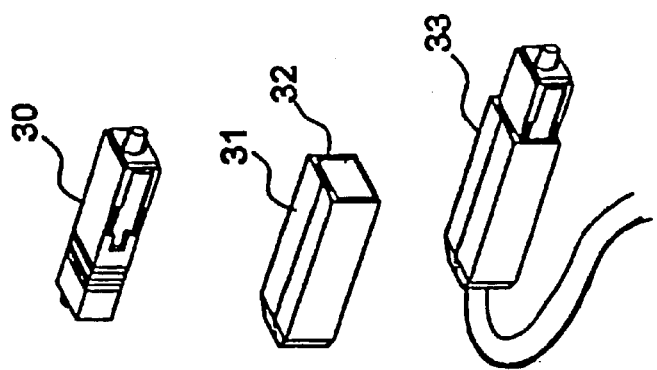
FIG 5
FIG 5A
FIG 5B
FIG 5C

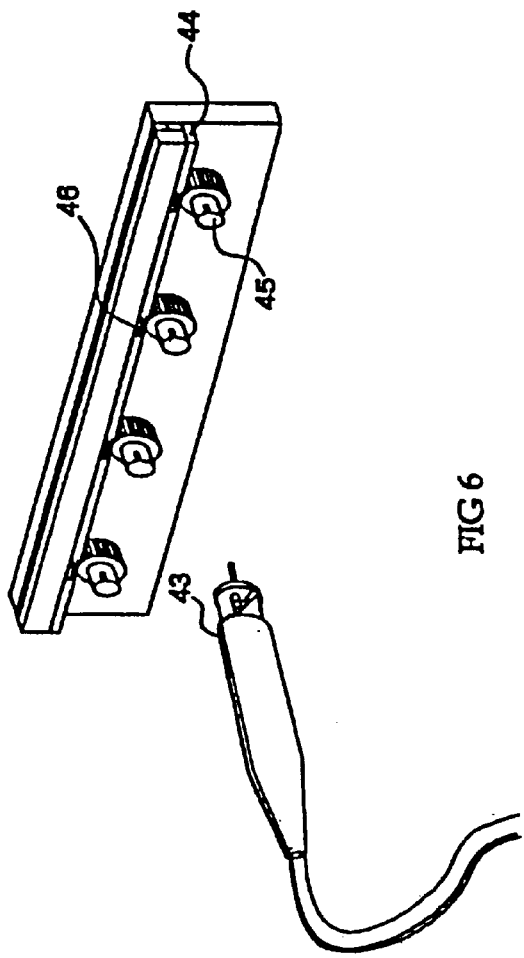
FIG 6
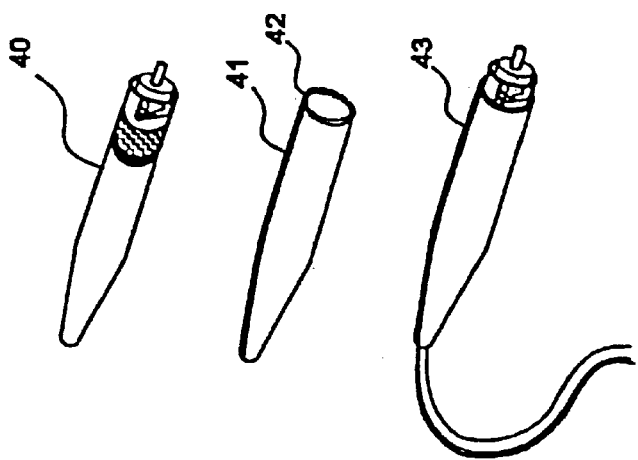
FIG 6A
FIG 6B
FIG 6C

SYSTEM FOR MONITORING CONNECTION PATTERN OF DATA PORTS

CROSS-REFERENCE TO RELATED APPLICATIONS

This application is a division of U.S. application Ser. No. 09/937,983, filed Oct. 3, 2001, entitled A System for Monitoring Connection Pattern of Data Ports, which issued as U.S. Pat. No. 6,574,586 on Jun. 3, 2003, and which is the National Stage of International Application No. PCT/SG00/00045, filed Apr. 5, 2000, which claims priority to Singapore Patent Application Nos. 9901521-6, filed Apr. 6, 1999, and 200001891-1, filed Apr. 5, 2000.

FIELD OF THE INVENTION

The present invention relates to the field of cabled systems and related computer peripheral devices, and more particularly to a system and method for determining interconnection pattern of data ports without requiring special patching cables or patching panels.

BACKGROUND OF THE INVENTION

The problems of tracking the interconnection pattern among the various ports in a local area network are well known to those skilled in the art. At least one system which deals with this problem is described in the U.S. Pat. No. 5,483,467 entitled "Patching Panel Scanner". The patent describes a patching panel scanner which automatically and continuously senses the interconnection arrangement of various ports such as computer ports and user ports. In this type of system, the interconnection between the ports are provided by patching cables or alternatively by apparatus of internal connection in patching panels such as the CLPP cordless patching panel available from RIT Technologies Ltd. of Tel Aviv, Israel.

In this type of system, in order to determine the interconnectivity pattern of the various ports, a conductor needs to interconnect the ports and deliver a signal to the scanner indicating the connection status of a particular port. In the modern computer era, it is actually difficult to provide a conductor for this purpose because most modern data cables being used to interconnect various devices have to meet a particular pre-determined standard in the industry. So for instance, a standard cable such as RJ45 eight wires per cable, each having an end which is adapted to mate with an RJ45 port. No free wire allows for scanning for interconnectivity.

Therefore, in the prior art scanner systems, the ports needed to be interconnected via a patch panel which required a special patch cable or an apparatus of internal connections in the patch panels. In any case, the ports could not be connected directly using standard cables. Although the need for and desirability of having a scanner system which can utilize standard cables clearly exist, so far, the industry has been unable to come up with such a system.

OBJECT OF THE INVENTION

It is therefore an objective of the present invention to provide a system for monitoring and determining the interconnectivity of ports which overcomes the shortcomings of the prior art system described above.

More particularly, it is an object of present invention to provide a system for monitoring and determining the interconnectivity of ports which does not require special patch panels or patch cables.

More particularly, it is an object of present invention to provide a system for monitoring and determining the interconnectivity of ports which utilizes standard connection cables.

SUMMARY OF THE INVENTION

The present invention determines and monitors the connection pattern of data ports which are connected by multiconductor cables without requiring special patch cables or patch panels. In order to electronically determine the connectivity between one port to another, it is generally well understood that an electrical conductor needs to connect one port to the other. Although this principle is well known, in the modem era where many of the standardized cables such as RJ11 and RJ45 are used, it is difficult to provide this dedicated conductor for connectivity-scanning purposes because each of the wires within the cable is used for a standardized purpose which may interfere with the connectivity-scanning operation.

In the present connectivity monitoring system, a dedicated conductor which may be attached to an existing cable is provided. The conductor interacts with an adapter board which is attached to a port where the cable is to be connected. To provide an additional contact point for the scanning operation, an adapter jacket is provided which attaches to an RJ45 jack. The adapter jacket is attached to the jack at both ends of the cable. The additional contact point for the scanning operation is provided via an external contact located on the outside of the adapter jacket. An external conductor wire connects the external contact of the jack at each end of the cable such that the contact at each respective end will be electrically coupled to each other.

To provide a contact point for the external contact of the adapter jacket at the port site, an adapter board is provided above the port sockets with each of the sockets having a socket contact. The socket contact is positioned such that when the RJ45 jack having the adapter jacket is inserted into a socket, the contact of the adapter jacket electrically mates with the socket contact of the adapter board.

In the overall system, the adapter board is coupled to an output module and an input module. The output driver module has a plurality of output drivers, and the receiver module has a plurality of latches (other similar electronic devices can be used instead of latches). Each of the socket contacts is uniquely connected to one output driver and one latch. The output module and the input module are both coupled to a micro-processor which is in turn coupled to a communication interface. The system may be coupled to a local area network or to a computer to report the information regarding the connection pattern.

Both the output module and the input module can be implemented using standard IC devices. The main function of the output module is to provide a plurality of output drivers which address the adapter contacts and to send a signal to the contacts when instructed to do so by the micro-processor. The main function of the input module is to provide a plurality of latches (or other similar devices) which also address the contacts and to receive the signal sent by the output drivers. The communication interface can also be implemented using standard devices currently available to interface between the micro-processor and local area network and electronic devices.

Now to describe the operation of the present system, the micro-processor has pre-designated one output driver as a first driver and the socket contact which it is connected to as the first contact. The latch in the input module which is connected to the designated first contact is designated as the first latch. The port corresponding to the first socket contact is considered to be the first port. Another driver is pre-designated as a second driver, and its corresponding socket contact is designated as a second contact and its corresponding latch is designated as a second latch. The same designation scheme is applied to third, fourth, fifth, and so on, driver/contact/latch groupings such that all groups are uniquely designated.

Initially, all of the socket contacts are at low state with no signal being sent to them by the output module. To monitor the connectivity of the various ports, the micro-processor causes the designated first output driver to send out a pulse signal to the socket contact which the micro-processor has designated as the first contact. This places the first socket contact at a high state, and consequently, also places the first latch in the input module at the high state. After sending out the signal, the micro-processor scans the input module for a latch having a high state. If only the first latch indicates a high, then the micro-processor concludes that no valid connection has been made between the first port and another port. If, however, a port other than the first port, port one, indicates a high state, for instance port seven, then the micro-processor concludes that the port is validly connected to port seven. Once the connectivity state of port one is determined, the result is stored in memory and the same process is repeated for port two and so on until all of the ports' connection status has been determined.

BRIEF DESCRIPTION OF THE DRAWINGS

FIGS. 5, 5A, 5B, 5C illustrate various other standard cables which can be adapted for use with the present system.

FIGS. 6, 6A, 6B, 6C illustrate various other standard cables which can be adapted for use with the present system.

DETAILED DESCRIPTION OF THE INVENTION

In order to electronically determine the connectivity between one port to another, it is generally well understood that an electrical conductor needs to connect one port to the other. Although this principle is well known, in the modern era where many of the standardized multi-conductor cables such as RJ11 and RJ45 are used, it is difficult to provide this dedicated conductor for connectivity-scanning purposes because each of the wires within the cable is used for a standardized purpose which may interfere with the connectivity-scanning operation. Although it may be possible to share an existing wire in the cable for the scanning operation, this would require additional circuitry for differentiating between the signals used for the scanning purposes and the signals used for other purposes such as data transfer. Moreover, in many cases, it may be impossible to effectively share an existing wire or conductor.

In the present connectivity monitoring system, a dedicated conductor which may be attached to an existing cable is provided. The conductor interacts with an adapter board which is attached to a port where the cable is to be connected. Although in describing the preferred embodiment of the present invention, a specific cable/port combination utilizing a common standard such as RJ45 will be shown, it should be appreciated that this is done for illustration purposes only, and is not meant to limit the present invention to this illustrative example.

Figure 1A:
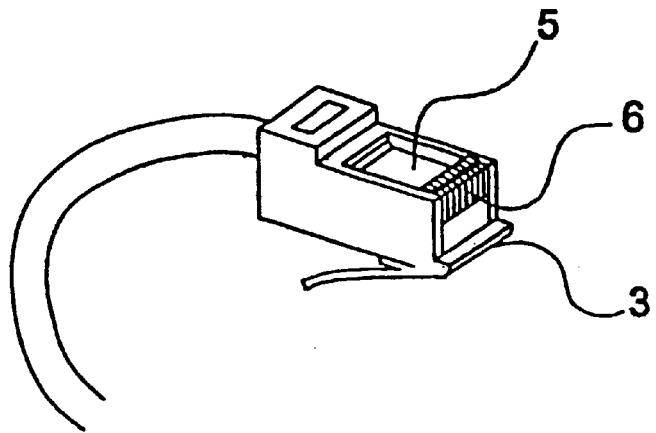
FIG. 1A is a perspective illustration of a current RJ45 cable which can be adapted to work with the present system.
Figure 1B:
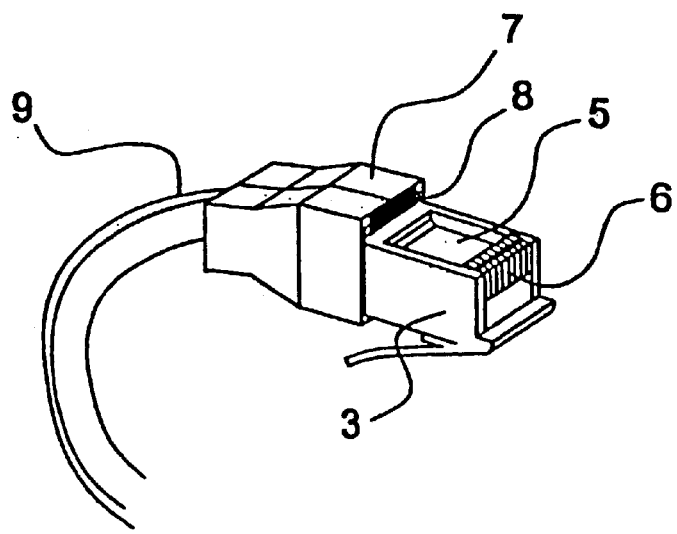
FIG. 1B is a perspective illustration of the RJ45 cable of FIG. 1A which has been fitted with an adapter jacket of the present invention.
Figure 1C:
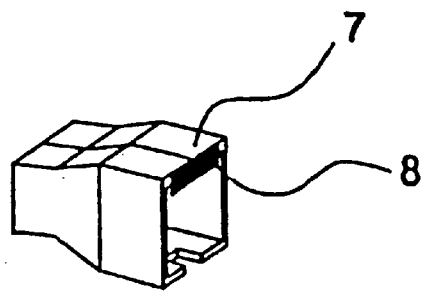
FIG. 1C is an isolated perspective illustration of an adapter jacket of the present invention which is adapted for an RJ45 cable jack.

Now in referring to FIG. 1A, a standard RJ45 cable 3 having a jack 5 is shown. Although only one end of the cable is shown here in FIG. 1A for illustration purposes, it should be understood that a similar jack is attached to the other end of the cable. The RJ45 jack 5 has eight standard contact points 6. To provide an additional contact point for the scanning operation, an adapter jacket 7, FIG. 1C, is provided which attaches to the RJ45 jack as shown in FIG. 1B. The adapter jacket is attached to the jack 5 at both ends of the cable 3 (though only one is shown in the figure). The additional contact point for the scanning operation is provided via an external contact 8 located on the outside of the adapter jacket 7. An external conductor wire 9 connects the external contact 8 of the jack 5 at each end of the cable 3 such that the contact 8 at each respective end will be electrically coupled to each other.

Figure 2:
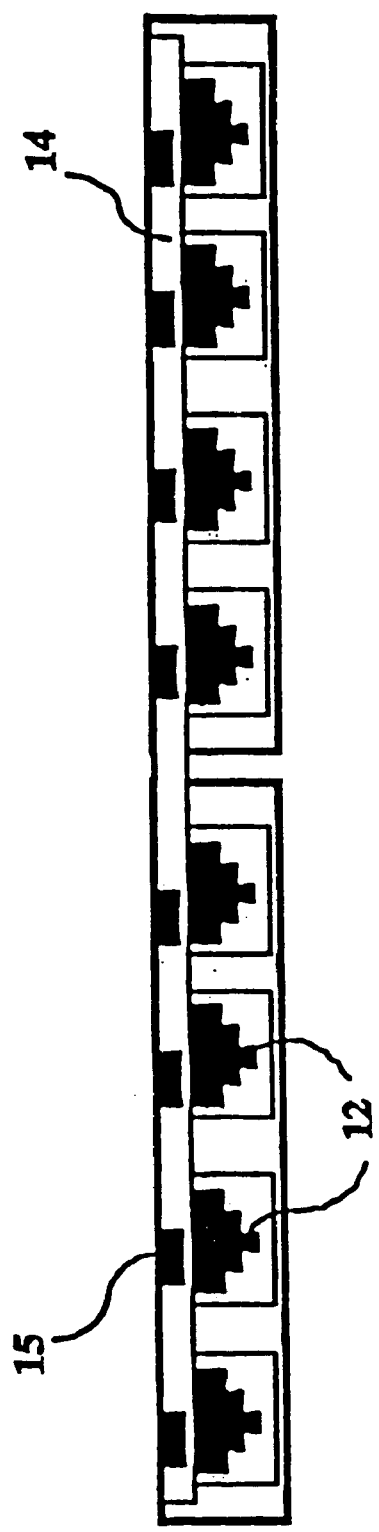
FIG. 2 is a front view of a plurality of RJ45 sockets fitted with an adapter board of the present invention.

Now referring to FIG. 2, a plurality of RJ45 sockets is shown which are standard sockets which mate with a standard RJ45 jack. The sockets may be ports for a network equipment such as a 10 Base-T hub, PABX, and keyphone system, or may be part of a patch panel, though a special patch panel is not required for a successful operation of the present system. To provide a contact point for the external contact 8 of the adapter jacket 7, an adapter board 14 is provided above the sockets 12 with each of the sockets 12 having a socket contact 15. The socket contact 15 is positioned such that when the RJ45 jack 5 having the adapter jacket 7, as shown in FIG. 1B, is inserted into a socket 12 of FIG. 2, the contact 8 of the adapter jacket 7 electrically mates with the socket contact 15 of the adapter board 14. Although here the adapter board 14 is shown to carry a plurality of socket contacts 15, it is entirely possible, and sometimes desirable, to have an adapter board 14 which carries only one socket contact which is used on a single isolated socket.

Figure 3:
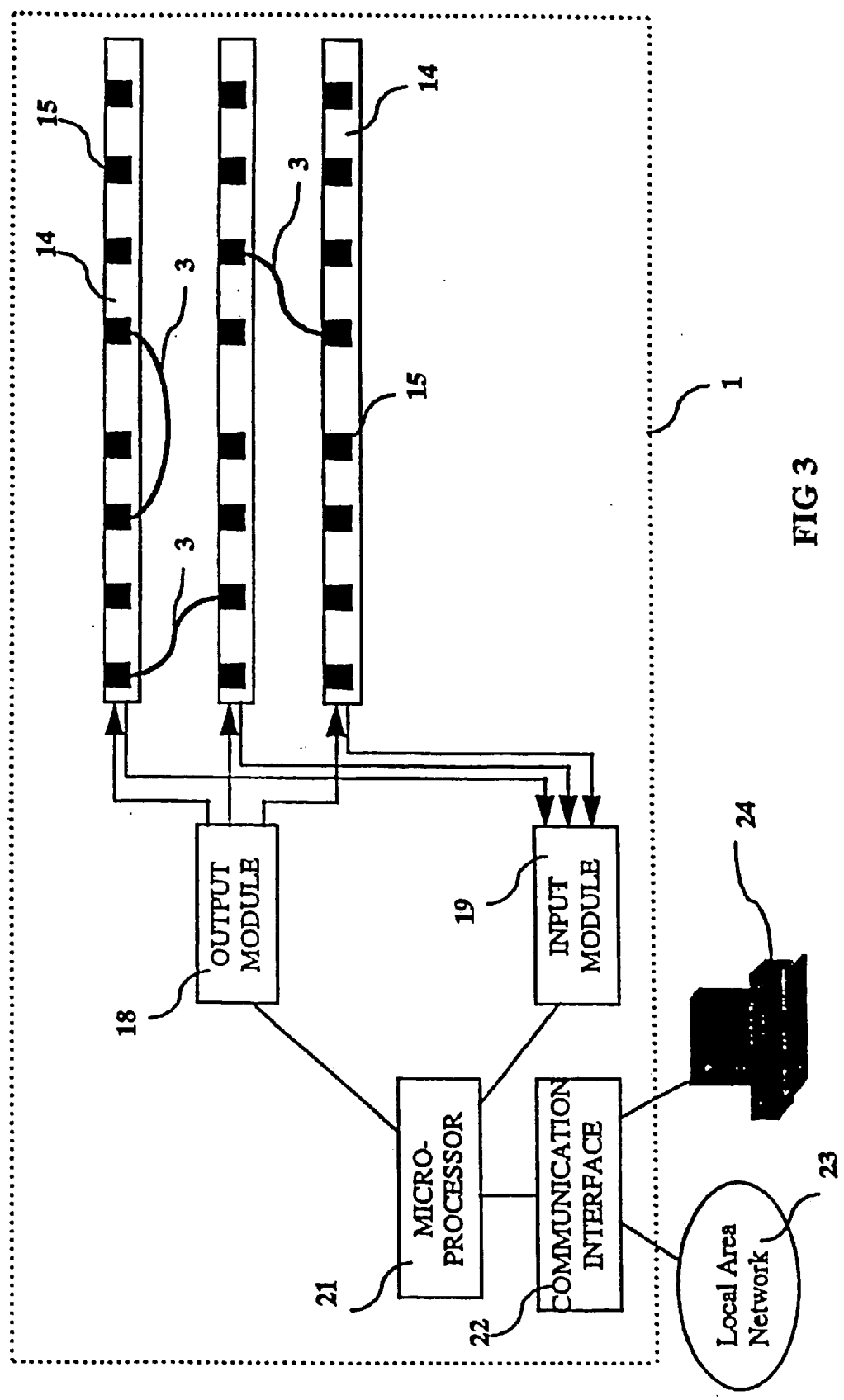
FIG. 3 is a simplified schematic illustration of the present connectivity monitoring system.
Figure 4:
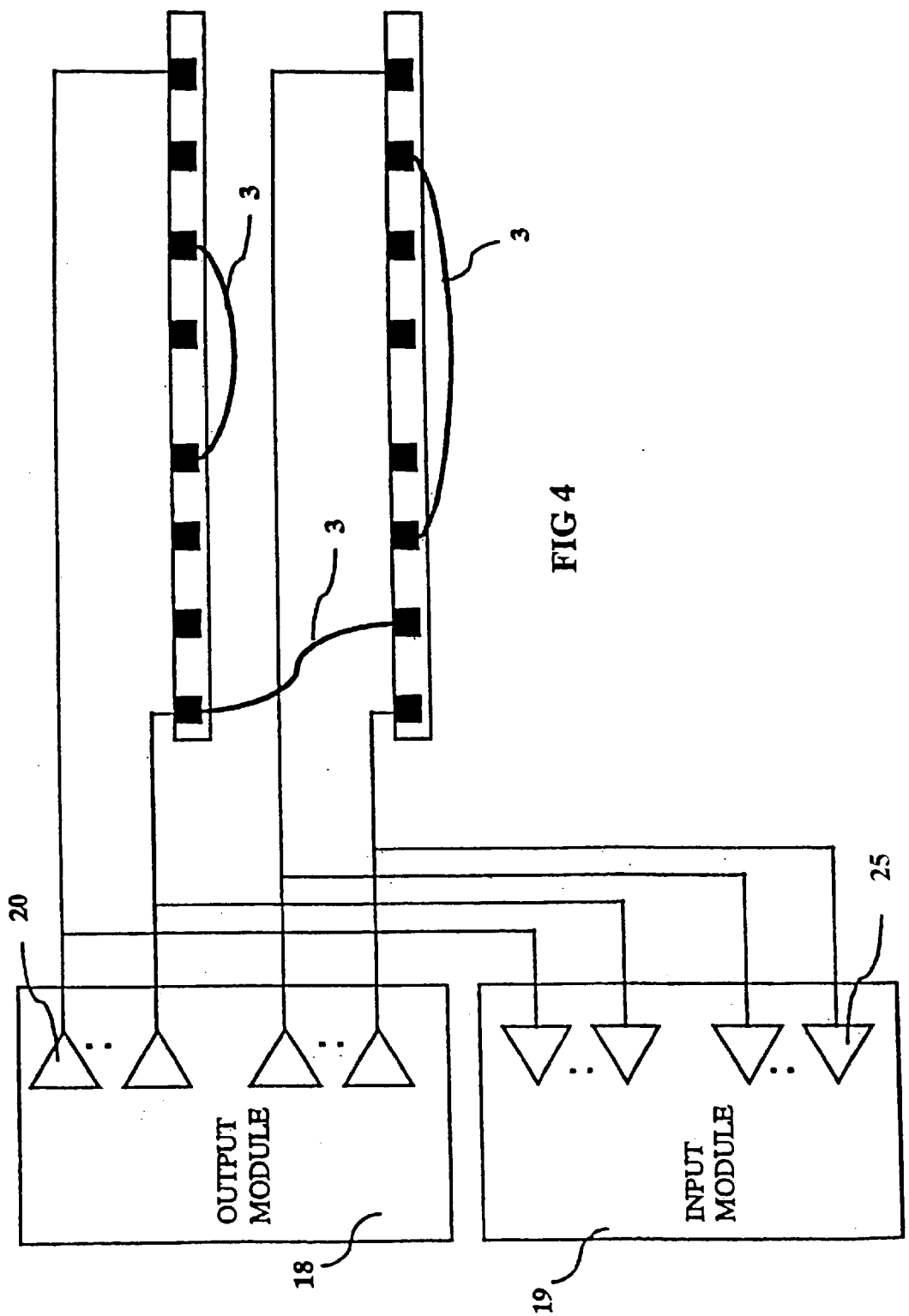
FIG. 4 is a simplified schematic illustration which shows the relationship between the output drivers, the socket contacts, and the receiver latches.

Referring now to FIG. 3, a simplified schematic illustration of the present system 1 is shown. The adapter board 14 of FIG. 2 is coupled to an output module 18 and input module 19. As shown in more detail in FIG. 4, the output driver module 18 has a plurality of output drivers 20, and the receiver module 19 has a plurality of latches 25 (other similar electronic devices can be used instead of latches). Each of the socket contacts 15 is uniquely connected to one output driver 20 and one latch 25. The output module 18 and the input module 19 are both coupled to a micro-processor 21 which is in turn coupled to a communication interface 22. The system 1 may be coupled to a local area network 23 or to a computer 24 to report the information regarding connectivity.

Both the output module and input module can be implemented using standard IC devices. The main function of the output module 18 is to provide a plurality of output drivers 20 which address adapter contacts 15 and to send a signal to the contacts 15 when instructed to do so by the micro-processor 21. The main function of the input module 19 is to provide a plurality of latches 25 (or other similar devices) which also address the contacts 15 and to receive the signal sent by the output drivers. The communication interface 22 can also be implemented using standard devices currently available to interface between the micro-processor 21 and local area network 23 and electronic devices.

Now to describe the system 1 in greater detail, the adapter board 14 shown in FIG. 3 is placed over port sockets (not shown in FIG. 3 but shown in FIG. 2). The micro-processor 21 has pre-designated one output driver as a first driver and the socket contact which it is connected to as the first contact. The latch in the input module 19 which is connected to the designated first contact is designated as the first latch. The port corresponding to the first socket contact is considered to be the first port. Another driver is pre-designated as a second driver, and its corresponding socket contact is designated as a second contact and its corresponding latch is designated as a second latch. The same designation scheme is applied to third, fourth, fifth, and so on, driver/contact/latch groupings such that all groups are uniquely designated. Of course, the designations are somewhat arbitrary and the particular designation number or scheme is not important so long as the individual groupings are uniquely traceable by the micro-processor 21.

Initially, all of the socket contacts 15 are at low state with no signal being sent to them by the output module 18. To monitor the connectivity of the various ports, the micro-processor 21 causes the designated first output driver to send out a pulse signal to the socket contact 15 which the micro-processor 21 has designated as the first contact. This places the first socket contact at a high state, and consequently, also places the first latch in the input module 19 at the high state. After sending out the signal, the micro-processor 21 scans the input module 19 for a latch having a high state. If only the first latch indicates a high, then the micro-processor 21 concludes that no valid connection has been made between the first port and another port. If, however, a port other than the first port, port one, indicates a high state, for instance port seven, then the micro-processor 21 concludes that the port 1 is validly connected to port seven. Once the connectivity state of port one is determined, the result is stored in memory and the same process is repeated for port two and so on until all of the ports' connection status has been determined.

While other scanning scheme can be employed with the present system, the scheme described above is the one employed in the preferred embodiment. The advantage of the scheme described above is that it allows any port to be connected to any other port. This is unlike patch panel scanning systems where one panel may need to be designated as the input panel, and the other panel is designated as the output panel, and a cable needs to connect a port from the output panel to a port from the input panel. The cable cannot connect, for instance, a port from the input panel to another port from the same input panel. This feature is particularly useful for the present invention because no special patch panels are required, and so the ports may be randomly spread out in no particular order.

In some situations, a user may wish to know the identity of a particular data port which has been fitted with the present invention. In previous systems, unless the port is properly labeled at the socket site, it is difficult for a user to ascertain the identity of the port without tracing the cable connecting the port all the way to its source. To provide a solution to this problem, the present system can optionally include a diagnostic pen which can assist in identifying a port simply by making contact with the socket contact corresponding to the port the user wishes to identify.

Figure 8:
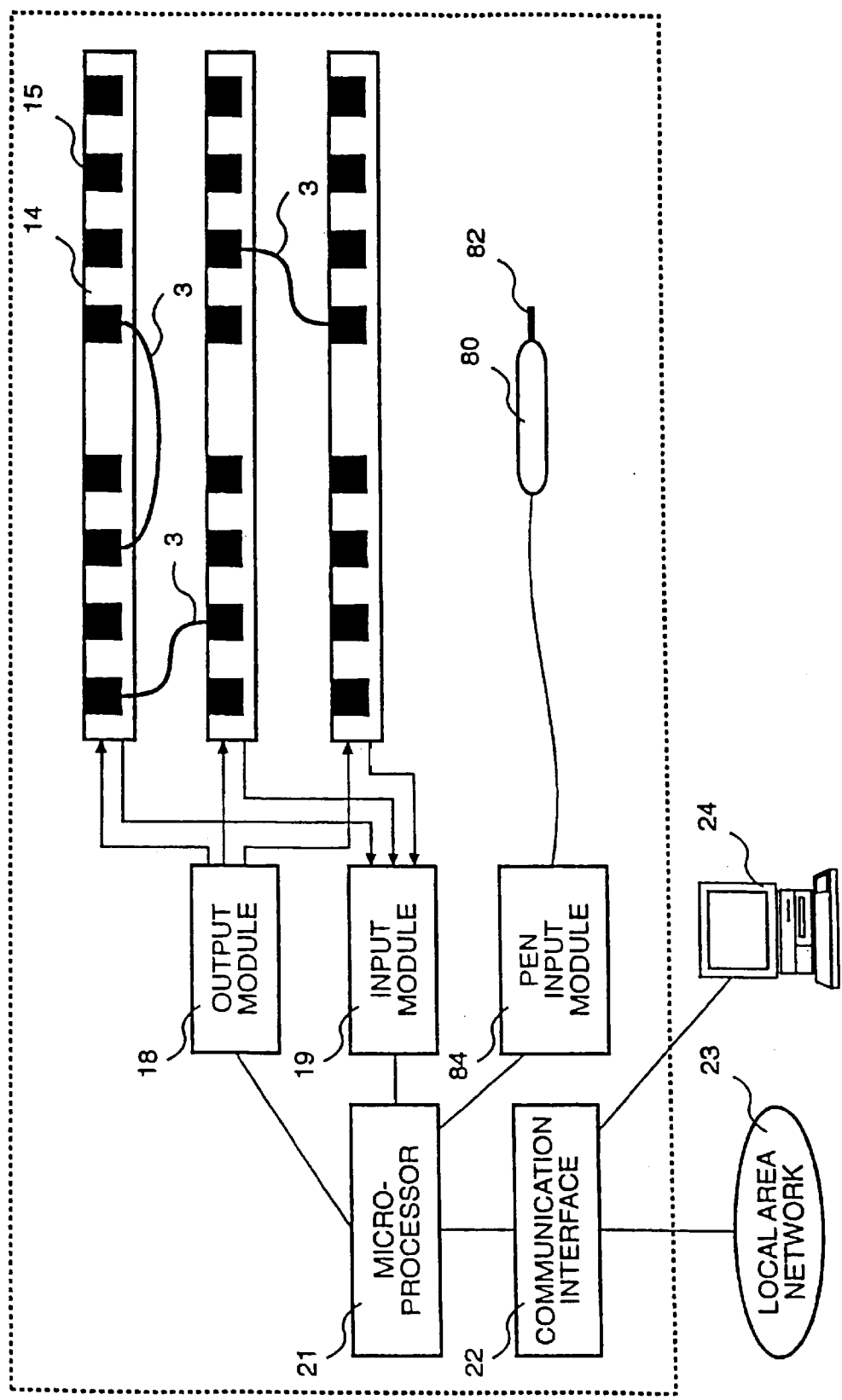
FIG. 8 is a simplified schematic illustration of the present connectivity monitoring system incorporating the optional diagnostic pen.
Figure 9:
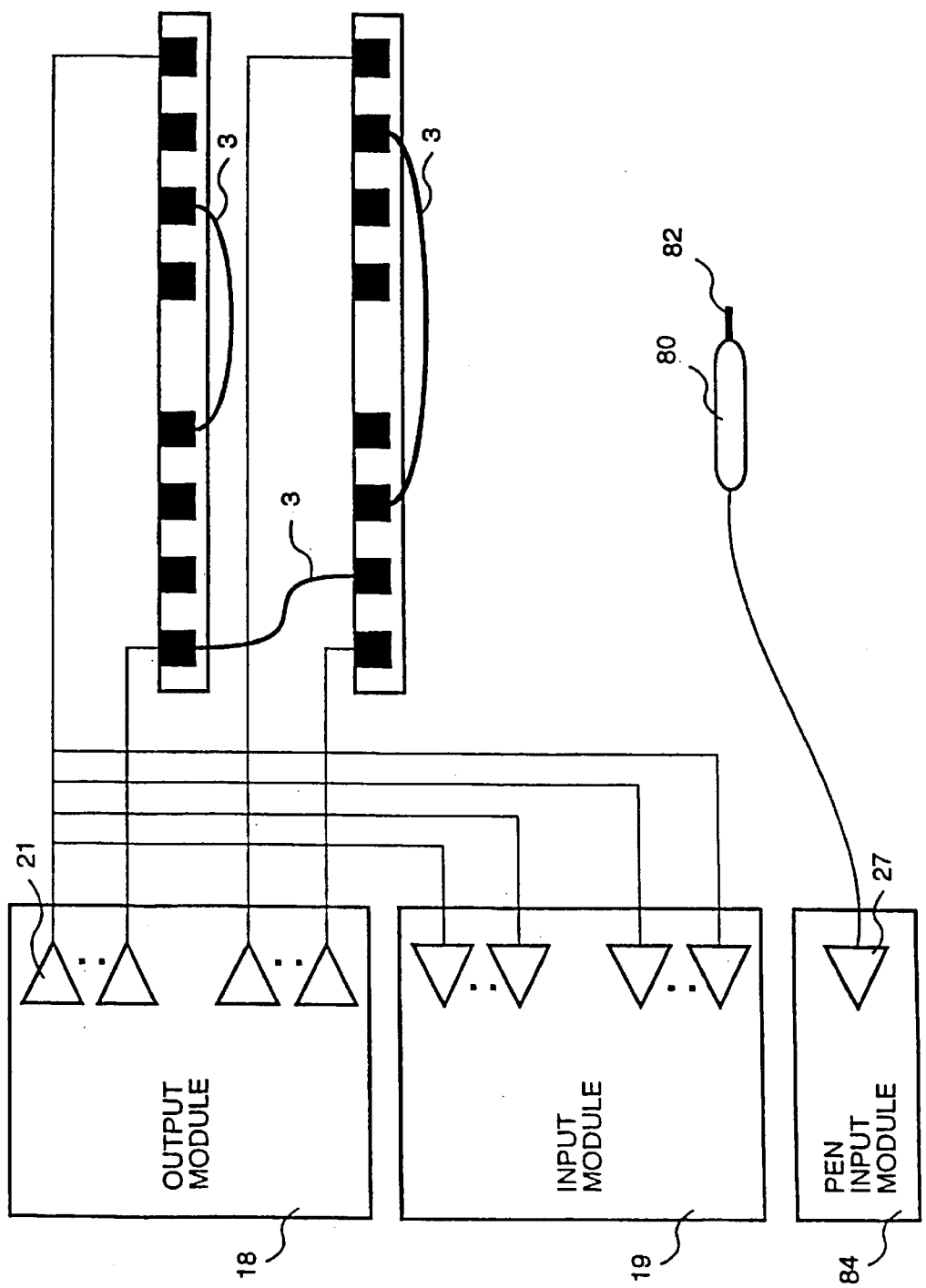
FIG. 9 is a simplified schematic illustration which shows the relationship between the output drivers, the socket contacts, the receiver latches, and the pen input latch.

The block diagram of the present system incorporating this diagnostic pen is shown in FIG. 8. As shown in FIG. 8, the pen 80 has an electrically conductive tip 82. The tip 82 is electrically coupled to a pen input module 84. The pen input module 84 is communicably coupled to the micro-processor 21. As shown in greater detail in FIG. 9, the pen input module 84 basically comprise a single latch 27 (or other similar device) for receiving an electrical signal.

To determine which socket contact 15 is making contact with the tip 82 of the diagnostic pen 80, the micro-processor 21 continually monitors the status of the pen input module 84. As explained above, the output module continually sends out an electrical signal to each of the socket contacts 15. Because each of the socket contacts 15 is uniquely addressed at the output module 18, each socket contact 15 is uniquely traceable. Therefore, the micro-processor 21 is always able to uniquely determine which socket contact 15 is being sent the electrical signal by the output module 18 at any given moment. Initially, when the tip 82 of the pen 80 is not making contact with any of the socket contacts, the pen input module 84 is at a low state because it has not receive any electrical signal. When the tip 82 touches one of the socket contacts 15, however, the pen input module 84 goes high. By determining which socket contact 15 the output module 18 has sent the signal to when the pen input module 84 goes high, the micro-processor 21 is able to determine which socket contact 15 has made contact with the pen tip 82. The data port corresponding to that particular socket contact 15 then can be identified.

Figure 13:
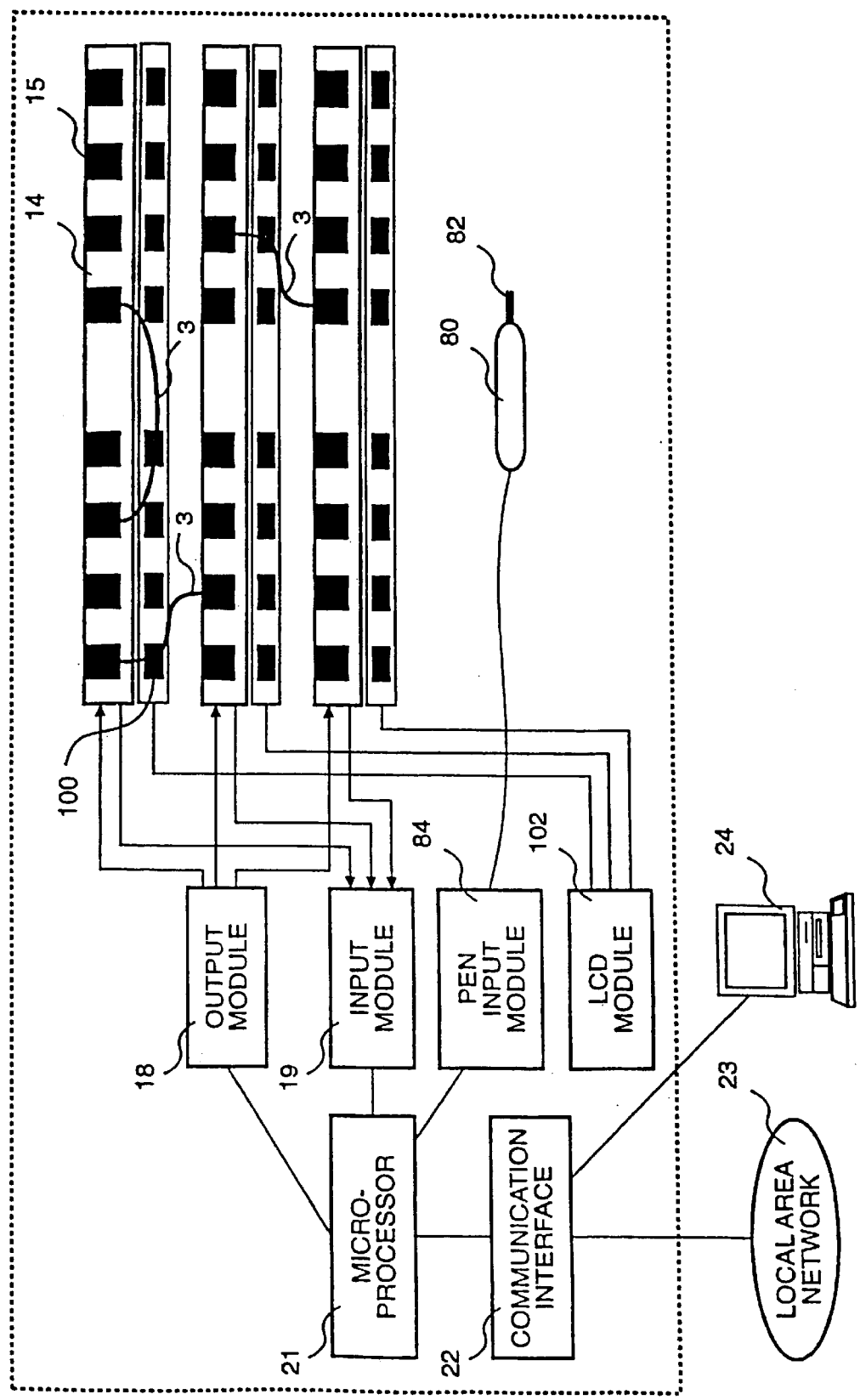
FIG. 13 is a simplified schematic illustration of the present connectivity monitoring system incorporating the optional diagnostic pen and LCD units.
Figure 14:
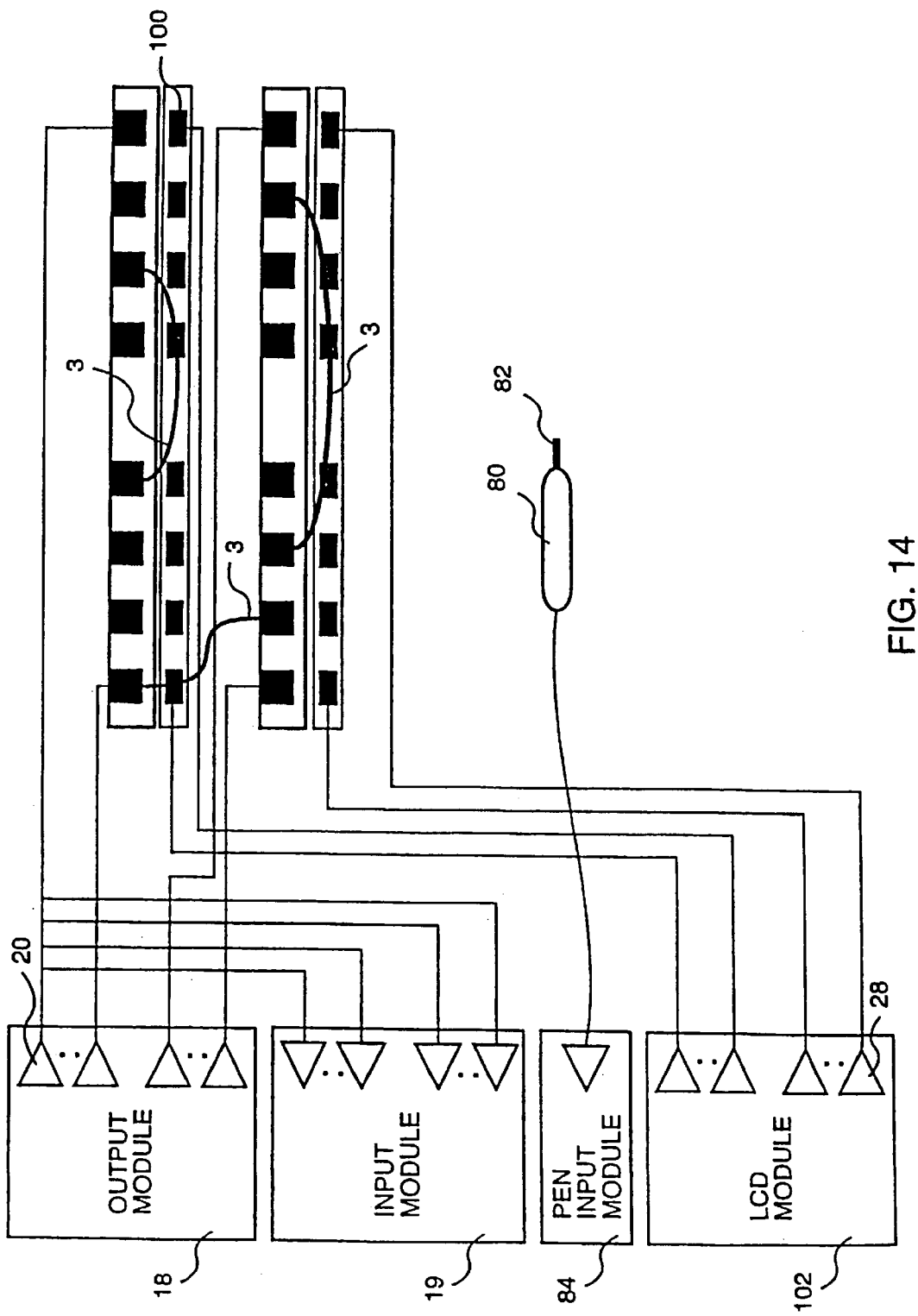
FIG. 14 is a simplified schematic illustration which shows the relationship between the output drivers, the socket contacts, the receiver latches, the pen input latch, and LCD drivers.

To further assist in the identification of the data ports, and also to facilitate greater flexibility to the present system, the present system can optionally further include liquid crystal display (LCD) units 100 for each of the ports as shown in FIG. 13. The LCD units 100 are mounted adjacent to the data ports, and are communicably coupled to an LCD module 102. The detailed schematic is shown in FIG. 14. The LCD module 102 basically comprise a plurality of output drivers 28 which are uniquely connected to the LCD units 100. The LCD units 100 will indicate information about a particular port, or a row of ports. For instance, the LCD unit may indicate the device which is connected to the port, the user name, IP address, etc. The LCD may be used in conjunction with the pen 80 such that by touching the socket contact of a particular port, the micro-processor sends the information about the port to the LCD unit corresponding to the socket contact which made contact with the pen 80. The LCD units 100 may also carry an interactive feature where a user can select different options based on a simple menu such as a YES/NO menu scheme where the user can indicate his choice by touching the socket contact (or alternatively a separate dedicated contact pad for the LCD units) with the pen 80. Although here the LCD units 100 were shown here to be separate units, it should be understood that a single continuous strip of LCD may be used.

Figure 7:
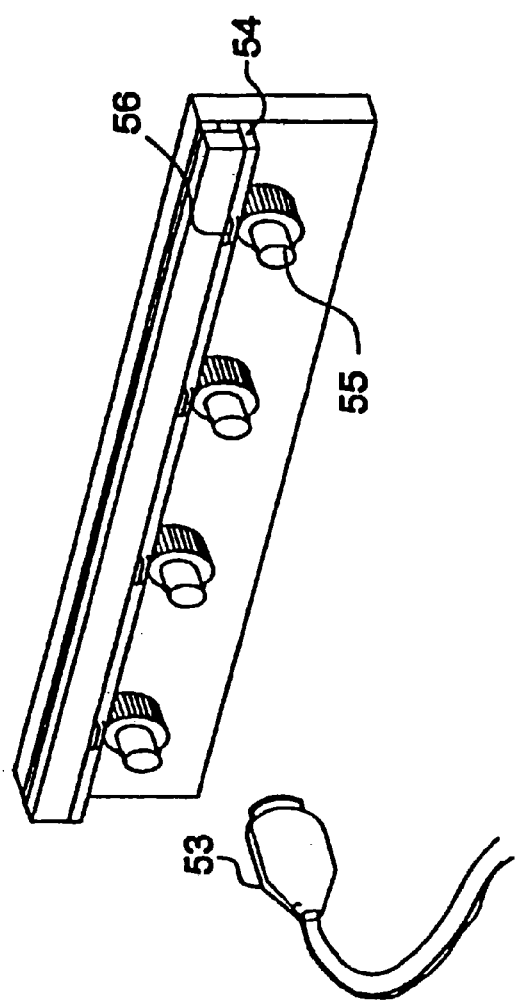
FIGS. 7, 7A, 7B, 7C illustrate various other standard cables which can be adapted for use with the present system.
Figure 7A:
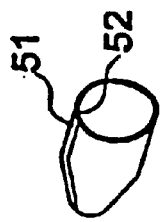
Figure 7B:
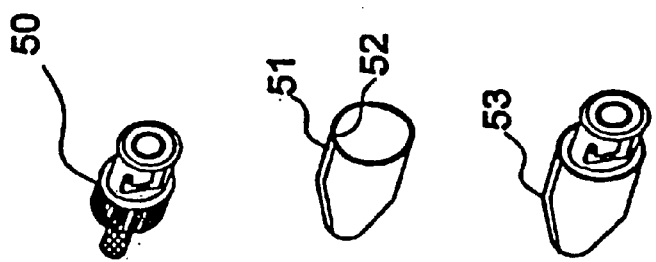
Figure 7C:
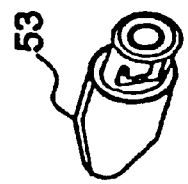

Although the present invention has been illustrated using the RJ45 standard, one skilled in the art should appreciate that the present invention can be implemented using other existing standards. Some such examples are shown in FIGS. 5, 6, and 7, where the currently available SC connectors, ST connectors, and BNC connectors, respectively, are fitted with an adapter jacket and their respective ports are provided with an adapter board.

In FIGS. 5, 5A, 5B, and 5C, a standard SC connector 30 is fitted with an adapter jacket 31 having a contact 32 to yield an adapted SC connector 33. Also, the SC connector sockets 35 have been fitted with adapter boards 34 with adapter contact points 36.

In FIGS. 6, 6A, 6B, and 6C, a standard ST connector 40 is fitted with an adapter jacket 41 having a contact 42 to yield an adapted ST connector 44. Also, the ST connector sockets 45 have been fitted with adapter boards 44 with adapter contact points 46.

In FIGS. 7, 7A, 7B, and 7C, a standard BNC connector 50 is fitted with an adapter jacket 51 having a contact 52 to yield an adapted BNC connector 55. Also, the BNC connector sockets 55 have been fitted with adapter boards 54 with adapter contact points 56.

Figure 10:
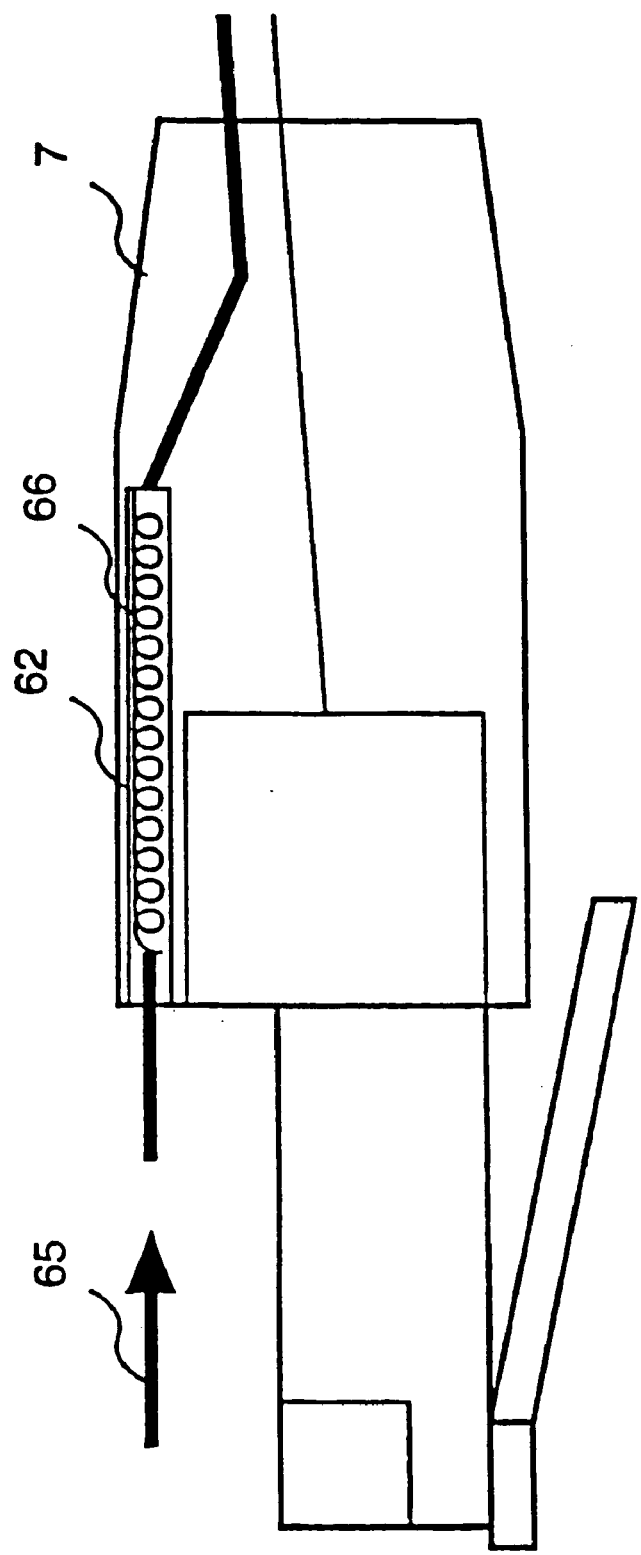
FIG. 10 illustrates an embodiment where the external contact is a pin which is supported by a spring.

In an alternative embodiment of the present invention, the external contact 8 of the adapter jacket 7 (as shown in FIG. 1C) is in the form of a contact pin 60 as shown in FIG. 10. In this embodiment, the pin 60 is slidably engaged in a barrel 62 which is placed inside the adapter jacket 64. The contact pin 60 is supported by a spring 66 which resides inside the barrel 62 and provides tension to the pin 60 when it is depressed in the direction shown by the arrow 65. The tension provided by the spring 66 allows the contact pin 60 to make better contact with the socket contact 15 of the adapter board 14 (FIG. 2). It should be appreciated by those skilled in the art that although a spring was shown here, the spring 66 may be replaced with other devices that can provide the necessary tension to the pin 60.

Figure 11:
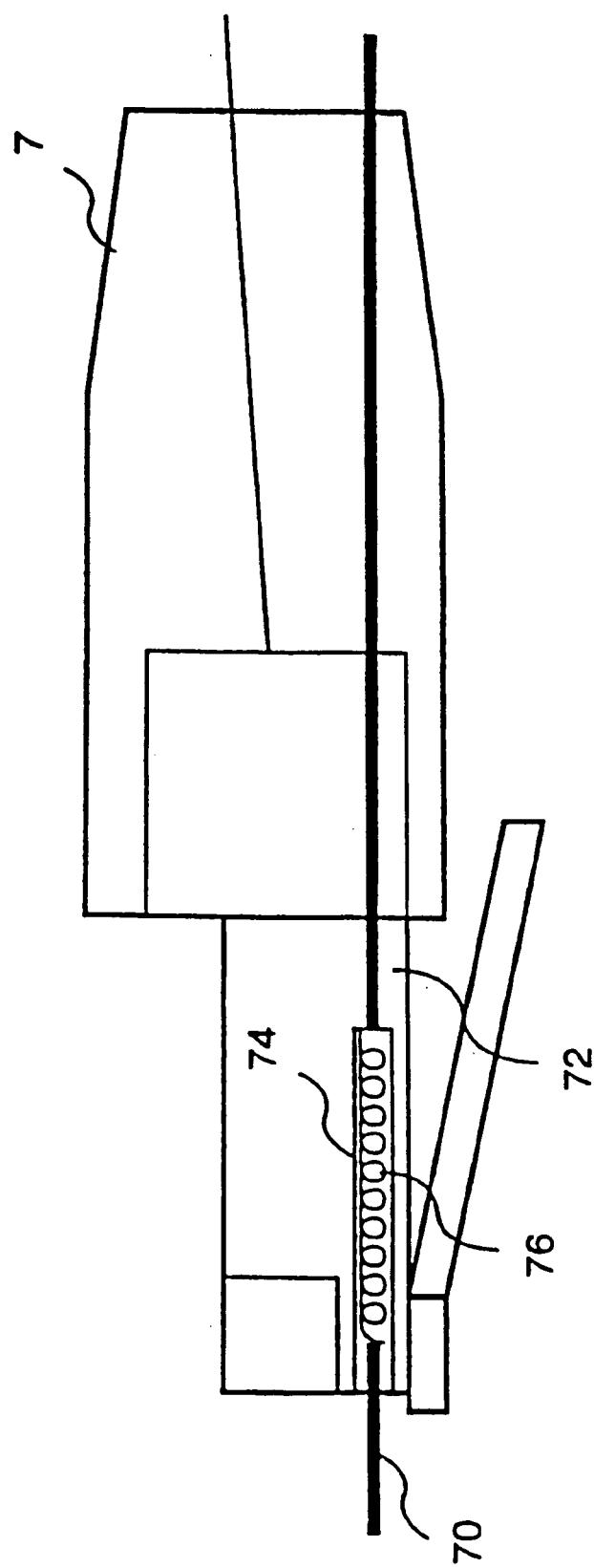
FIG. 11 illustrates an embodiment where the external contact is placed in the jack itself.

In another embodiment of the present invention, the external contact is placed within the standardized jack itself. An example of such an embodiment is shown in FIG. 11. Here, the contact pin 70 is placed on the RJ45 jack 72 itself. Similar to the embodiment shown in FIG. 10, the contact pin 70 is slidably engaged in a barrel 74 and also supported by a spring 76. It is to be understood however, that it is possible to have an external contact without the barrel 74 and the spring 76. In this embodiment, the socket contact is placed inside the socket itself to make contact with the contact pin 70.

Figure 12:
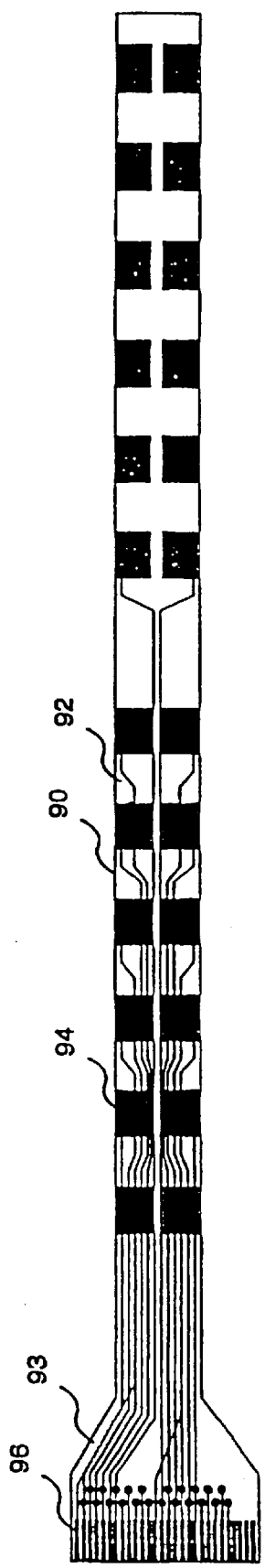
FIG. 12 illustrates adapter strip which is fabricated out of flex tape.

In yet another embodiment of the present invention, a flex tape may be used to form an adapter strip 90, as shown in FIG. 12, which is an embodiment of the adapter board. The adapter strip 90 may be provided with an adhesive such that it can be conveniently pasted adjacent to the sockets. The adapter strip 90 comprises a main body 92 and a head portion 93 which are fabricated from flex tape which is a common substrate material currently being used to support electronic circuitry. The main body 92 has a plurality of contacts 94 which are spaced in correspondence with the spacing of the data ports for which the adapter strip is to be placed adjacent to. Two rows of contacts may be provided such as shown in FIG. 12 to accommodate two rows of ports located above and below the adapter strip 90. However, an adapter strip having only a single row is clearly possible. Each contact 94 is connected by a conductor such as a wire which ends in a conductor strip 96 at the head portion 93. The wire strips 96 provide a convenient way to electrically mate the adapter strip 90 to the output 18 and input modules 19.

In yet another embodiment of the present invention, the socket contact is in the form of a port or a socket which tightly mates with the external contact. In yet another embodiment of the present invention, the adapter jacket is integrated with the standardized multiconductor cable.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims and all changes which come within the meaning and range of equivalency of the claims are, therefore, to be embraced therein.

What is claimed is:

1. A kit for determining connection pattern of data ports which are interconnected by standardized multiconductor cables, said data ports each having a standardized socket, and said multiconductor cables each having a standardized jack at each end of the cable which mates with said socket, said kit comprising:

a plurality of adapter boards having a plurality of socket contacts, said adapter boards to be placed adjacent to said socket;

a plurality of adapter jackets to be fitted over said standardized jack, each of said adapter jackets having an external contact for electrically connecting with said socket contacts when said adapter jacket is fitted over said standardized jack and said standardized jack is mated with said standardized socket;

output signal drivers to be uniquely coupled to each socket contact, said output signal drivers being operative to send a signal to said socket contact;

input signal receivers to be uniquely coupled to each said socket contact for receiving said signal sent by said output signal drivers;

a micro-processor to be coupled to said output signal drivers and said input signal receivers for controlling said signal sent by said output signal drivers and for detecting signals received by said input signal receivers, said micro-processor interpreting said signals to determine the connection pattern of said data ports; and an output indicator coupled to said micro-processor for indicating the connection pattern of said data ports as determined by said micro-processor.

2. The kit as recited in claim 1 wherein said microprocessor determines the connection pattern of said data ports by sending a signal to a socket contact and determining which of the input signal receivers have received the signal, and repeating the process for every socket contact.

3. A kit for determining connection pattern of data ports, said data ports each having a standardized socket, said kit comprising:

a plurality of adapter boards having a plurality of socket contacts, said adapter boards to be placed adjacent to said socket;

a plurality of multiconductor cables, said cables having a standardized jack at each end, each of said jacks having an external contact for electrically connecting with said socket contacts when said jack is mated with said socket;

output signal drivers to be uniquely coupled to each socket contact, said output drivers being operative to send a signal to said socket contact;

input signal receivers to be uniquely coupled to each said socket contact for receiving said signal sent by said output signal drivers;

a micro-processor to be coupled to said output signal drivers and said input signal receivers for controlling said signal sent by said output signal drivers and for detecting signals received by said input signal receivers, said micro-processor interpreting said signals to determine the connection pattern of said data ports; and an output indicator coupled to said micro-processor for indicating the connection pattern of said data ports as determined by said micro-processor.

4. The kit as recited in claim 3 wherein said microprocessor determines the connection pattern of said data ports by sending a signal to a socket contact and determining which of the input signal receivers have received the signal, and repeating the process for every socket contact.

* * * * *